(12) United States Patent
Johnson et al.

(10) Patent No.: US 6,404,690 B2
(45) Date of Patent: Jun. 11, 2002

(54) REFRESH DRIVE CIRCUIT FOR A DRAM

(75) Inventors: Bret Johnson, München; Robert Kaiser, Kaufering; Helmut Schneider, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/845,625

(22) Filed: Apr. 30, 2001

(30) Foreign Application Priority Data

Apr. 28, 2000 (DE) .......................................... 100 21 085

(51) Int. Cl.⁷ .................................................. G11C 7/00
(52) U.S. Cl. ........................................ 365/222; 365/149
(58) Field of Search ................................ 365/222, 149, 365/189.09

(56) References Cited

U.S. PATENT DOCUMENTS

| 5,272,676 A | * 12/1993 | Kubono et al. ............. 365/222 |
| 5,278,769 A | 1/1994 | Tillinghast et al. |
| 5,539,703 A | 7/1996 | Manning |

* cited by examiner

*Primary Examiner*—Huan Hoang
(74) *Attorney, Agent, or Firm*—Laurence A. Greenberg; Werner H. Stemer; Ralph E. Locher

(57) ABSTRACT

A refresh drive circuit for feeding refresh signals to a memory device has a refresh signal generator for generating a continuous sequence of refresh signals with a frequency which decreases as the temperature falls. The refresh drive circuit is connected to the memory device and as the temperature of the memory device falls, the frequency of refresh cycles decreases resulting in a decrease in current consumption.

5 Claims, 3 Drawing Sheets

REFRESH DRIVE CIRCUIT FOR A DRAM

BACKGROUND OF THE INVENTION

Field of the Invention

The invention relates to a refresh drive circuit for feeding refresh signals to a memory device. The refresh drive circuit has a refresh signal generator for generating a continuous sequence of refresh signals with a predetermined frequency.

In the case of dynamic random access memories (DRAMs), it is necessary for the information stored in the memory cells to be refreshed at cyclic intervals. Since, in the DRAM memory cells, the information is stored as capacitor charges and the capacitors effect self-discharge, due to leakage currents, in particular at high temperatures, the storage charges of the capacitors have to be repeatedly renewed.

The refreshing of the memory contents of the cell array in the DRAM is generally carried out row by row by an internal refresh drive configuration. To that end, with the aid of a refresh signal generator, a continuous sequence of refresh signals with a predetermined frequency is generated, which are applied to the memory cells. In modern memory modules, refresh cycles of at least 4096 refresh operations per 64 ms (refresh rate 4k/64 ms) are customary. The number of refresh operations must be chosen in such a way that even at the high operating temperature of the computer containing the DRAM and with the large leakage currents of the capacitors which are produced as a result, the capacitors in the DRAM are regularly recharged. The refresh operations therefore lead to a high current consumption of the memory modules and thus shorten, in particular, the operating duration of accumulator or battery-operated computers.

U.S. Pat. No. 5,278,796 discloses a refresh drive circuit. In the case of the drive circuit, the refresh frequency is adapted in discrete steps to the respective operating temperatures in the DRAM, in order to reduce, in particular, the current consumption in the standby mode. U.S. Pat. No. 5,539,703 discloses a further refresh signal generator for a DRAM, in which the refresh frequency is set as a function of the respective operating voltage in order to reduce the current consumption in the DRAM in the standby mode.

SUMMARY OF THE INVENTION

It is accordingly an object of the invention to provide a refresh drive circuit for a DRAM which overcomes the above-mentioned disadvantages of the prior art devices of this general type, which reduces the current consumption of dynamic random access memories.

With the foregoing and other objects in view there is provided, in accordance with the invention, a refresh drive configuration for feeding refresh signals to a memory device. The refresh drive configuration contains a refresh signal generator for generating a continuous sequence of the refresh signals with a predetermined frequency and the refresh drive configuration is connected to the memory device. The refresh signal generator is configured such that the predetermined frequency of the refresh signals generated decreases as a temperature falls in the memory device. The refresh signal generator contains a voltage-controlled oscillator and a circuit having a diode with a temperature-dependent anode voltage connected to the voltage-controlled oscillator. The voltage-controlled oscillator receives applied control voltages that are dependent on the temperature-dependent anode voltage of the diode.

In the refresh drive configuration for feeding the refresh signals to a memory device, the refresh signal generator for generating the continuous sequence of refresh signals is configured such that the frequency of the refresh signals generated decreases as the temperature decreases.

The configuration of the refresh drive circuit reduces the number of refresh cycles when the temperature decreases in the memory modules, i.e. when the memory modules in the computer change from the full-load mode to the standby mode. The reduction of the refreshed cycles in turn ensures a significant reduction of the current consumption of the DRAMs. This is particularly advantageous in the case of accumulator- or battery-operated computers with DRAMs, in which the reduced power consumption of the DRAMs in the standby mode through a reduction of the number of refresh cycles of the capacitors of the DRAMs enables the maximum operating duration of the computers to be significantly prolonged.

In accordance with a preferred embodiment, the refresh signal generator is configured such that the frequency of the refresh signals is halved in the event of a temperature drop of approximately 100° C. This both ensures reliable recharging of the capacitors in the DRAM memory cells and at the same time provides for an optimal reduction of the current consumption of the cell array.

In accordance with a further preferred embodiment, the refresh signal generator is a voltage-controlled oscillator, the control voltage used being the anode voltage of a diode which decreases as the temperature of the diode increases. This embodiment of the refresh drive circuit makes it possible to set an optimal temperature response of the frequency of the refresh cycle of the capacitors in the DRAM.

In accordance with an added feature of the invention, the circuit has differential amplifiers connected to and between the diode and the voltage-controlled oscillator, the temperature-dependent anode voltage of the diode is amplified by a factor of 2–10 by the differential amplifiers.

In accordance with an additional feature of the invention, the applied control voltages of the voltage-controlled oscillator are determined by the temperature-dependent anode voltage of the diode.

Other features which are considered as characteristic for the invention are set forth in the appended claims.

Although the invention is illustrated and described herein as embodied in a refresh drive circuit for a DRAM, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
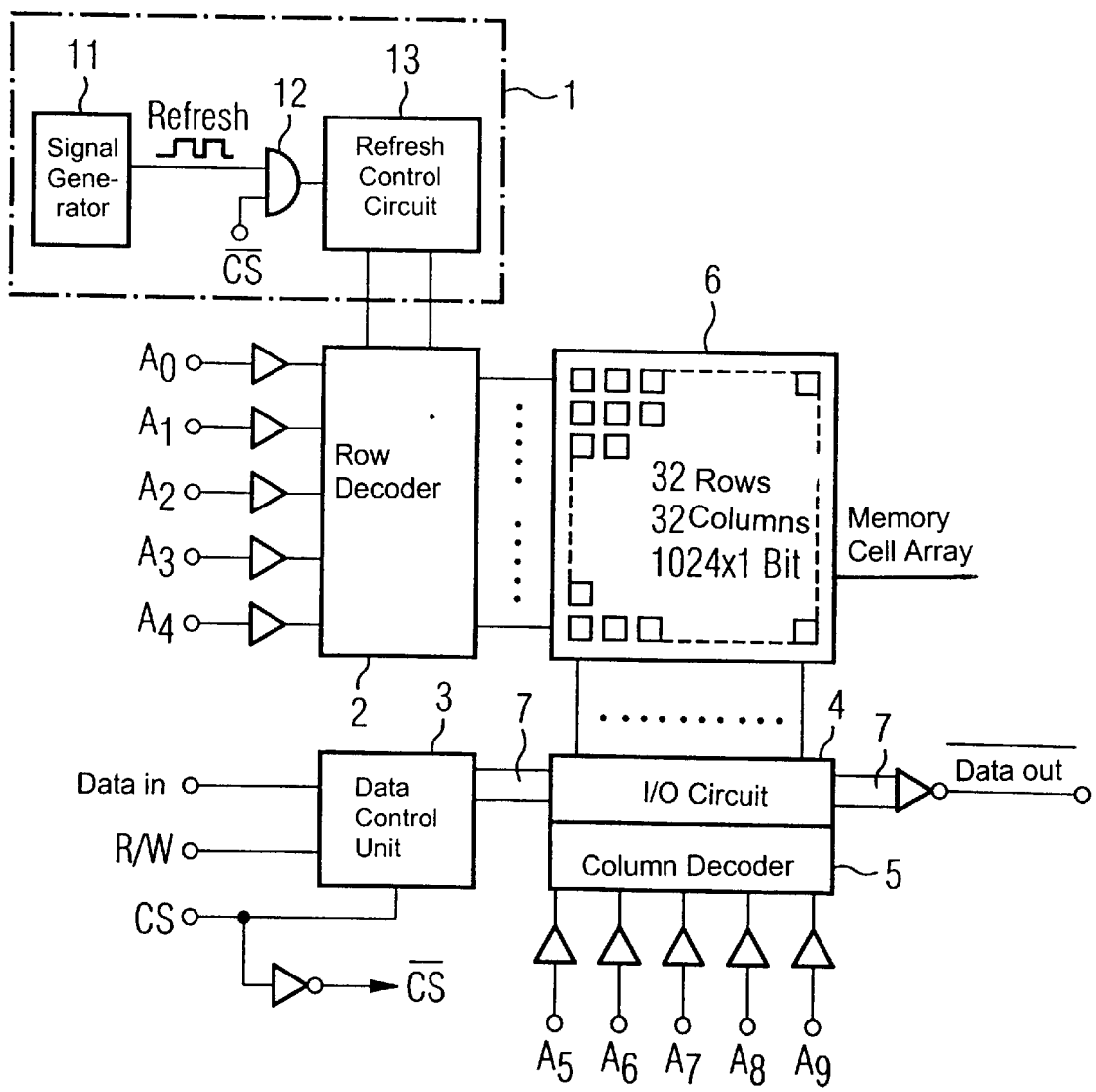
FIG. 1 is a block diagram of a structure of a dynamic random access memory and an integrated refresh logic according to the invention.

In all the figures of the drawing, sub-features and integral parts that correspond to one another bear the same reference symbol in each case. Referring now to the figures of the drawing in detail and first, particularly, to FIG. 1 thereof, there is shown a block diagram of a DRAM. Reference symbol 1 represents a refresh drive configuration integrated in the DRAM. Reference symbol 2 represents a row decoder for decoding address lines $A_0$–$A_4$. Reference symbol 3 represents a data control configuration. Reference symbol 4 represents a column input/output circuit, reference symbol 5 represents a column decoder for decoding the signals fed via address lines $A_5$–$A_9$, and reference symbol 6 represents a cell array. Reference symbol 7 designates a read/write bus which, in conjunction with the data present at the data control configuration 3, in a manner dependent on a read/write signal R/W and a chip select signal CS, carries out writing to the cell array 6 or, via the column input/output circuit 4, reading from the cell array 6. In the embodiment illustrated, the cell array 6 contains 32 rows and 32 columns, which corresponds to a dynamic memory having a capacity of one kbit (1024×1 bit).

The refreshing of the memory contents of the cell array 6 is carried out row by row by the internal refresh drive configuration 1. To that end, a signal generator 11 in the refresh drive configuration 1 applies a refresh clock signal through an AND element 12 to a refresh control circuit 13. Refreshing being performed only when the cell array 6 is not addressed and an inverted chip select signal (CS=1) is thus additionally present at the AND element 12. Consequently, the refresh cycles must always be inserted into the instruction stream to the modules of the cell array 6, a refresh rate of 4k/64 ms generally being used.

Such a high cycle rate is necessary in order to prevent the information that is stored in the modules of the cell array 6 and is present as capacitor charges from being lost on account of leakage currents. The leakage currents occur, in particular, when the computer in which the memory module is used is in the full-load mode. This is because the large number of data operations in the computer, in particular including the operations of writing to and reading from the cell array 6, have the effect, as a result of the electric currents occurring in the process, of bringing about a high temperature in the computer and hence in the memory module, which leads to increased leakage currents and hence to a faster discharge of the capacitors. Therefore, the refresh rate of the DRAM must be set in such a way that even at the maximum operating temperature in the computer, the capacitors in the DRAM are refreshed in a timely manner, so that no memory contents are lost.

In contrast, in the standby mode of the computer, that is to say when the computer is largely switched off and data operations are no longer performed, the temperature in the computer and hence in the memory module decreases. At the reduced standby mode temperature compared with the full-load mode temperature, the leakage currents of the capacitors in the DRAM also decrease, with the result that the time for recharging the capacitors in order to retain the memory information can be prolonged.

According to the invention, the refresh signal generator 11 in the DRAM therefore has a temperature response in the case of which the clock rate of the refresh signals is decreased as the temperature decreases. The refresh signal generator 11 is preferably configured in such a way that the frequency of the refresh signals which are applied to the refresh control circuit 13 through the AND element 12 is halved. The temperature response of the refresh signal generator 11 is preferably chosen in such a way that the refresh signal frequency decreases with temperature to a greater extent than linearly, since the leakage currents in the capacitor also fall to a greater extent than linearly as the temperature decreases. As a result of the reduction of the refresh cycles in the standby mode, that is to say when the temperature falls in the computer, the current consumption for the refresh operations in the DRAM is significantly reduced. This reduced current consumption in turn enables a distinctly prolonged operating duration of accumulator-controlled or battery-controlled computers, that is to say, in particular, of portable devices.

Figure 2:
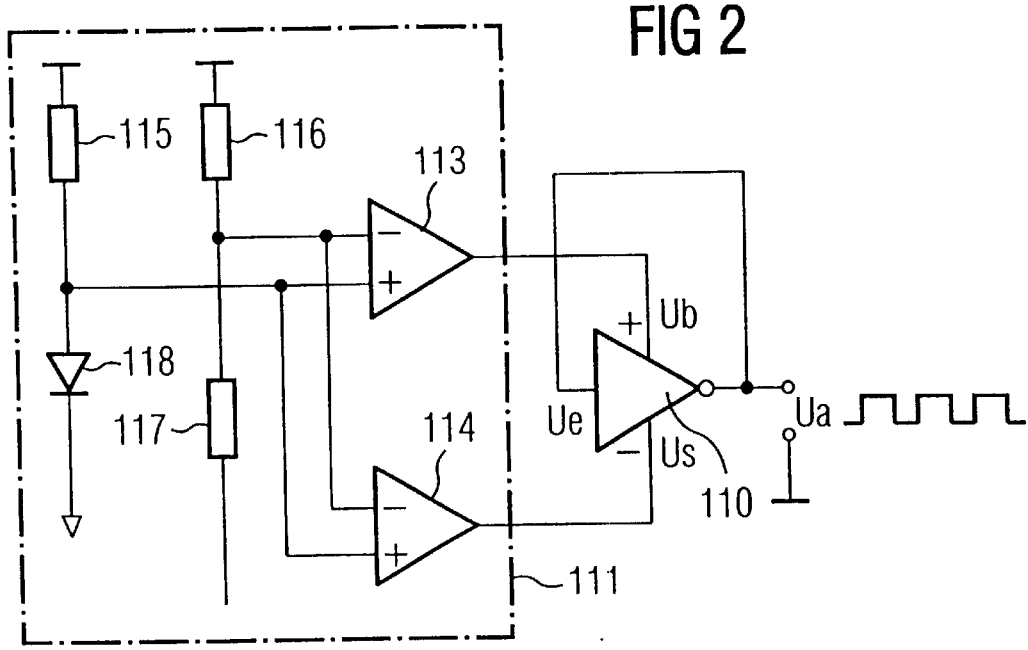
FIG. 2 is a circuit diagram of an embodiment of a refresh signal generator.

FIG. 2 shows a possible embodiment of the refresh signal generator 11 with temperature response. The refresh signal generator 11 has a voltage-controlled oscillator 110 containing a comparator circuit e.g. in the form of a Schmitt trigger circuit. The voltage-controlled oscillator 110 is connected to a positive control voltage $+U_b$ and a negative control voltage $-U_b$. An input voltage $U_e$ is present at the voltage-controlled oscillator 110, which voltage corresponds, by feedback, preferably to the output voltage $U_a$ of the voltage-controlled oscillator 110. The input voltage $U_e$ is integrated by an integrator circuit in the voltage-controlled oscillator 110. If the integrated voltage then reaches a positive or negative trigger level of the voltage-controlled oscillator 110, depending on the direction in which the integrated voltage proceeds, the output voltage $U_a$ of the voltage-controlled oscillator 110 instantaneously changes its signs. As a result, the voltage that is fed back to the input and is integrated in the integrator then proceeds in the opposite direction until the other trigger level is reached. A square-wave voltage is thus produced at the output of the voltage-controlled oscillator 110, the frequency of the square-wave oscillation being determined by the rise time of the integrator in the voltage-controlled oscillator 110, which depends on the control voltage values $+U_b$ and $-U_b$, respectively.

The control voltage values are supplied by a voltage source 111, the voltage values applied to the voltage-controlled oscillator 110 being temperature-dependent. Reference symbols 113 and 114 designate a first and a second operational amplifier of the voltage source 111. Reference symbols 115, 116 and 117 correspond to first, second and third resistors in the voltage source and reference symbol 118 corresponds to a diode. The first operational amplifier 113 of the voltage source 111 supplies the positive control voltage $+U_b$ to the voltage-controlled oscillator 110. For this purpose, a voltage determined by the first resistor 115 and the diode 118 is present at the non-inverted input of the first operational amplifier 113. By contrast, a reference voltage determined by the second resistor 116 and the third resistor 117 is applied to the inverted input of the operational amplifier 113.

In order that the second operational amplifier 114 supplies the negative control voltage $-U_b$ to the voltage-controlled oscillator 111, the voltage determined from the first resistor 115 and the diode 108 is applied to the non-inverted input of the second operational amplifier 114 and the reference voltage determined by the second resistor 116 and the third resistor 117 is applied to the inverted input. The two operational amplifiers 113, 114 amplify the difference between the voltage prescribed by the first resistor 115 and the diode 118 and the reference voltage defined by the two resistors 116 and 117. In this case, the gain factor can be set to the trigger voltage values required for the voltage-controlled oscillator 110.

The output voltages that are supplied by the two operational amplifiers 113, 114 and serve as control voltages for the voltage-controlled oscillator 111 are determined by an anode voltage of the diode 118. However, the anode voltage supplied by the diode 118 is temperature-dependent, the anode voltage decreasing as the temperature rises. The temperature in the diode 118 in turn essentially depends on the temperature in the memory module and hence in the computer, with the result that the anode voltage of the diode 118 increases when there is a transition from the full-load mode temperature to the standby mode temperature. As a result, the voltage levels supplied by the operational amplifiers 113, 114 to the voltage-controlled oscillator 110 increase, the levels determining the rise time of the integrator. This in turn has the consequence that the frequency with which the voltage-controlled oscillator 101 changes over decreases and, as a result, the refresh cycles of the memory array, which are determined by this frequency, are prolonged.

Figure 3:
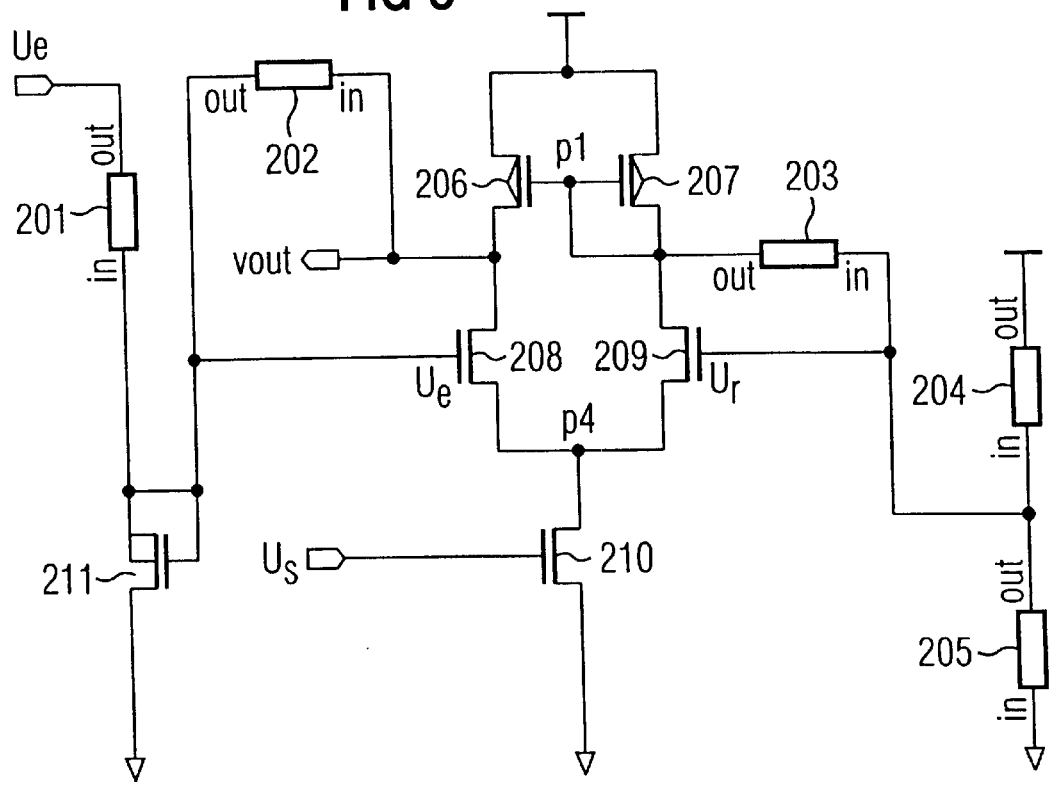
FIG. 3 is a circuit diagram of a part of a temperature-dependent voltage source for a voltage-controlled oscillator.

FIG. 3 shows, in detail, a possible embodiment of a temperature-dependent voltage source. In the temperature-dependent voltage source, reference symbols 201 to 205 correspond to a first to fifth resistors, reference symbols 206 and 207 correspond to first and second normally off p-type MOSFETS, reference symbols 208 to 210 correspond to first to third normally off n-type MOSFETs and reference symbol 211 corresponds to a diode. The amplifier circuit in the voltage source is composed of two current paths, the first current path having a series circuit containing the first p-type MOSFET 206 and the first n-type MOSFET 208, and the second current circuit having a series circuit containing the second p-type MOSFET 207 and the second n-type MOSFET 209. The current paths are in turn connected in series with the third n-type MOSFET 210.

A temperature-dependent input voltage $U_e$ is present at a gate of the first n-type MOSFET 208. The temperature-dependent input voltage $U_e$ is determined by a voltage divider containing the first resistor 201 and the diode 211, the temperature dependence of the input voltage resulting from the temperature dependence of the anode voltage of the diode 211. In the embodiment illustrated, the diode 211 is an n-channel FET diode.

The reference voltage $U_r$ is present at the gate of the second n-type MOSFET 209, the reference voltage being determined by a voltage divider composed of the fourth and fifth resistors 204, 205. Furthermore, the reference voltage $U_r$ is also present at the two gates of the first p-type MOSFET 206 and the second p-type MOSFET 207. The two p-type MOSFETs 206, 207 thus form a mirror current source that provides for a constant current in the two current paths of the amplifier circuit. A further control voltage $U_s$, which defines the operating point and the rise time of the amplifier circuit, is present at the third n-type MOSFET 210.

The output voltage $U_a$ of the amplifier circuit is tapped off on the first current path between the first p-type MOSFET 206 and the first n-type MOSFET 208. The output voltage $U_a$ corresponds to the difference between the input voltage $U_e$ and the reference voltage $U_r$, voltage amplification occurring which is essentially defined by the second resistor 202 and the third resistor 203. In this case, the second resistor 202 determines the voltage fed back to the input of the first n-type MOSFET 208 and the third resistor 203 determines the voltage coupled into the second current path between the second p-type MOSFET 207 and the second n-type MOSFET 209. The circuit shown makes it possible to set a voltage gain over a wide range through a suitable choice of the second and third resistors 202, 203, in particular. The voltage source shown in FIG. 3 constitutes an n-type source with a low output voltage, in which case, with a rise in the temperature in the diode 211, the output voltage also rises, i.e. there is a positive temperature response. The voltage rise with temperature is in turn converted into a lower frequency of a refresh signal in a voltage-controlled oscillator, as is shown in FIG. 4.

Figure 4:
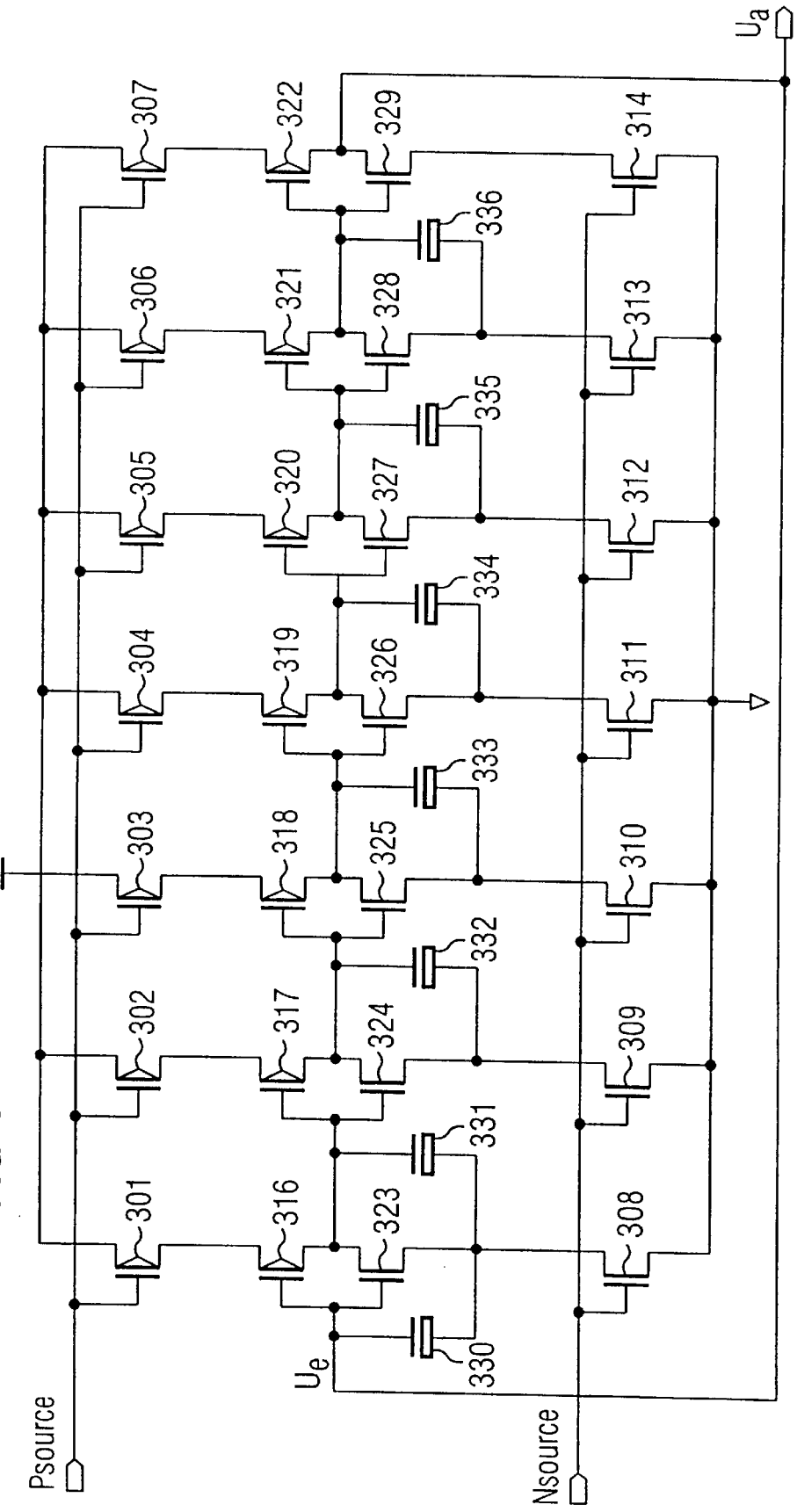
FIG. 4 is a circuit diagram of an embodiment of a voltage-controlled oscillator for generating refresh signals.

The embodiment of the voltage-controlled oscillator as shown in FIG. 4 is a ring oscillator that is controlled by a high voltage (p-type source) and a low voltage (n-type source). In this case, the low voltage may be supplied by a temperature-dependent voltage source with a positive temperature response, as is shown in FIG. 3. The high voltage may be prescribed by a voltage source that essentially has a similar structure to the voltage source shown in FIG. 3, but here the reference voltage $U_r$ is applied to the first n-type MOSFET 208 in the first current path of the amplifier circuit and the temperature-dependent input voltage $U_e$ is applied to the second n-type MOSFET 209 in the second current path of the amplifier circuit. A negative temperature response of the output voltage is obtained as a result of this.

The ring oscillator shown in FIG. 4 is a cascade circuit having seven series-connected oscillator paths, reference symbols 301 to 307 corresponding to normally off p-type MOSFETs, which are switched by the high voltage applied to the gates of these switching MOSFETs. Analogously, normally off n-type MOSFETs identified by reference symbols 308 to 315 are switched by the low voltage applied to the ring oscillator. Each p-type switching MOSFET is connected in series with a further normally off p-type MOSFET, which are identified by reference symbols 316 to 322. Correspondingly, each n-type switching MOSFET 308 to 314 is connected in series with a further normally off n-type MOSFET, which are identified by reference symbols 323 to 329 in FIG. 4. Each oscillator path thus contains a series circuit containing a p-type switching MOSFET, a p-type resonant-circuit MOSFET, an n-type resonant-circuit MOSFET and an n-type switching MOSFET. The gates of the p-type switching MOSFET and of the n-type switching MOSFET are always coupled together in this case, capacitors identified by reference symbols 330 to 335 in FIG. 4 respectively being disposed in parallel with the gates.

The individual oscillator paths are furthermore coupled to one another, the sources of the p-type switching MOSFETs 301 to 307 and also the sources of the n-type switching MOSFETs 308 315 being connected to one another. Furthermore, the output voltage $U_a$ of the ring oscillator is additionally present as input voltage $U_e$ at the gate of the first p-type resonant-circuit MOSFET 316 and of the first n-type resonant-circuit MOSFET 323, the output voltage being tapped off between the drains of the seventh p-type switching-circuit MOSFET 322 and of the seventh n-type switching-circuit MOSFET 329. The drains of the first p-type switching-circuit MOSFET 316 and of the first n-type switching-circuit MOSFET 321 are in turn connected in series with the gates of the switching-circuit MOSFETs in the second oscillator circuit and these are in turn connected in series with those in the third etc. up to the seventh oscillator circuit.

The oscillator circuit illustrated in FIG. 4 generates a square-wave oscillation of the output voltage, in the case of which the frequency is determined by the applied high voltage and the applied low voltage. The voltages determine the current flow via the p-type switching MOSFETs 301 to 307 and n-type switching MOSFETs 308 to 315 and hence the rise time of the capacitors 330 to 335. The rise time in turn defines the time required to reach one of the trigger levels, as a result of which the sign of the output voltage is reversed. This results in a square-wave oscillation that reciprocates between the trigger levels and whose frequency is determined by the high or low control voltage, respectively.

We claim:

1. A refresh drive configuration for feeding refresh signals to a memory device, the refresh drive configuration comprising:

a refresh signal generator for generating a continuous sequence of the refresh signals with a predetermined frequency and to be connected to the memory device, said refresh signal generator configured such that the predetermined frequency of the refresh signals generated decreases as a temperature falls in the memory device, said refresh signal generator containing a voltage-controlled oscillator and a circuit having a diode with a temperature-dependent anode voltage connected to said voltage-controlled oscillator, and said voltage-controlled oscillator receiving applied control voltages being dependent on the temperature-dependent anode voltage of said diode.

2. The refresh drive configuration according to claim 1, wherein said circuit has differential amplifiers connected to and between said diode and said voltage-controlled oscillator, the temperature-dependent anode voltage of said diode is amplified a factor of 2–10 by said differential amplifiers.

3. The refresh drive configuration according to claim 1, wherein said refresh signal generator is configured such the predetermined frequency of the refresh signals is at least halved in an event of a temperature decrease of approximately 100° C. of the memory device.

4. The refresh drive configuration according to claim 3, wherein the applied control voltages of said voltage-controlled oscillator are determined by the temperature-dependent anode voltage of said diode.

5. The refresh drive configuration according to claim 3, wherein said circuit has differential amplifiers connected to and between said diode and said voltage-controlled oscillator, the temperature-dependent anode voltage of said diode is amplified by a factor of 2–10 by said differential amplifiers.

* * * * *